United States Patent [19]
Vance

[11] Patent Number: 4,583,239
[45] Date of Patent: Apr. 15, 1986

[54] DIGITAL DEMODULATOR ARRANGEMENT FOR QUADRATURE SIGNALS

[75] Inventor: Ian A. W. Vance, Newport, England

[73] Assignee: STC plc, London, England

[21] Appl. No.: 662,050

[22] Filed: Oct. 18, 1984

[30] Foreign Application Priority Data

Oct. 29, 1983 [GB] United Kingdom ............... 8328949

[51] Int. Cl.[4] ............... H03D 1/22; H03D 3/00; H03D 5/00; H04B 1/30
[52] U.S. Cl. ............... 375/94; 329/107; 375/39; 375/77; 375/80; 455/324
[58] Field of Search ............... 375/39, 80, 94, 23, 375/86, 77; 455/60, 324; 329/107

[56] References Cited

U.S. PATENT DOCUMENTS

| | | | |
|---|---|---|---|
| 3,609,555 | 9/1971 | Van Blerkom et al. | 329/107 |
| 3,701,948 | 10/1972 | McAuliffe | 375/77 |
| 3,953,805 | 4/1976 | Couvillon | 455/324 |
| 3,955,191 | 5/1976 | Lambourn | 340/347 NT |
| 4,090,145 | 5/1978 | Webb | 375/77 |
| 4,470,147 | 9/1984 | Goatcher | 375/77 |
| 4,509,017 | 4/1985 | Andren et al. | 375/80 |

FOREIGN PATENT DOCUMENTS

| | | |
|---|---|---|
| 1450989 | 9/1976 | United Kingdom . |
| 2106734 | 4/1983 | United Kingdom . |

Primary Examiner—Marc E. Bookbinder
Attorney, Agent, or Firm—Kerkam, Stowell, Kondracki & Clarke

[57] ABSTRACT

A direct conversion receiver in which the quadrature I and Q signals are converted into pulse density modulated digital data streams by delta-sigma modulators 14, 15. The resultant digital data streams are then processed in a logic block 18 according to predetermined logic truth tables. The digital output of the processor 18 is then converted back to an analogue signal.

4 Claims, 9 Drawing Figures

DIGITAL DEMODULATOR ARRANGEMENT FOR QUADRATURE SIGNALS

BACKGROUND OF THE INVENTION

This invention relates to digital demodulation arrangements for quadrature signals formed in a zero I.F. or direct conversion radio receiver.

In British patent application No. 8127797 (Ser. No. 2106734A) there is described a direct conversion receiver incorporating a multi-mode digital demodulator, using the configuration shown in FIG. 1. In this receiver, the input signals from the antenna (or from the cable system or whatever) are mixed in two mixers 1, 2 with a local oscillator 3. In either the oscillator or signal path a quadrature network is interposed 4 or 4' such that the relative phases of either the signal or the local oscillator have a phase difference of 90° at the two mixers. (As an alternative, two 45° phase shift networks of opposite sign may be used, one in the signal and one in the local oscillator). The outputs from the mixers are low-pass filtered 5,6 to select the difference frequency between the input signal and the local oscillator. After amplification 7,8 (if necessary) the signals in the two channels (termed the 'I' or in-phase and the 'Q' or quadrature channels) are converted from analogue to digital form I', Q' by elements 9, 10. The digital signals are processed in a digital signal processing block 11, which may consist of hardwired logic or which may be a microprocessor(s) programmed with software. The processor performs the demodulation of the signals and may also provide filtering and other post-detection functions. It further may provide specialised outputs such as feedback to the other receiver parts to control gain or phase—such feedback being either digital or converted to analogue via a digital to analogue converter.

SUMMARY OF THE INVENTION

The present invention provides for a simplified realisation of the digital processor demodulator using an approximation to the perfect system disclosed in the prior art and, inter alia, makes use of a particular form of analogue-to-digital converter. A demodulator for both amplitude and phase modulations is described, together with a number of variants to provide additional functions.

According to the present invention there is provided a radio receiver having a first signal path in which a signal is mixed with a local oscillator frequency running at the main transmission frequency and then filtered to give a first mixed signal defined as an in-phase signal (I), a second signal path in which the received signal is mixed with the local oscillator frequency but with a relative phase shift and then filtered to give a second mixed signal defined as a quadrature signal (Q), each signal path including analogue-to-digital conversion means whereby the I and Q signals are converted into pulse density modulated (PDM) digital data streams respectively, the receiver also including a logic means to which the outputs of the PDM streams are applied, whereby the logic means output is a demodulation of the digital signals.

BRIEF DESCRIPTION OF THE DRAWINGS

Embodiments of the invention will now be described with reference to FIGS. 2-9 of the accompanying drawings, in which.

DESCRIPTION OF A PREFERRED EMBODIMENT

Figure 1:
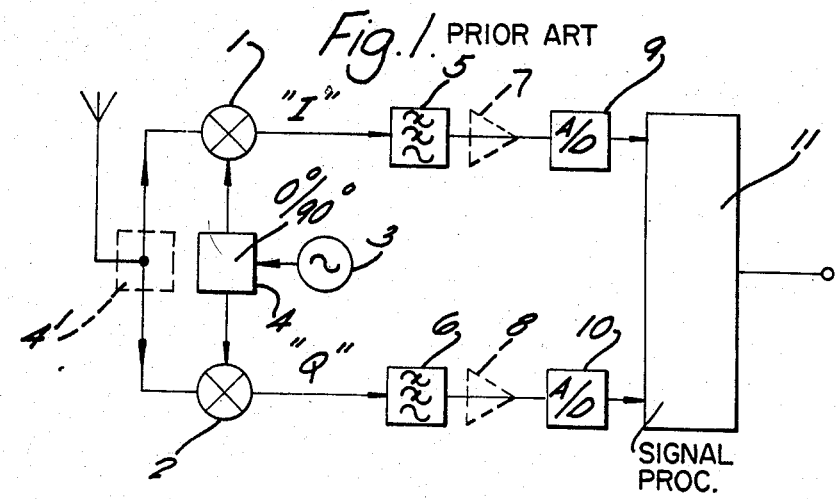
FIG. 1 illustrates a prior art direct conversion receiver incorporating a multi-mode digital demodulator.
Figure 2:
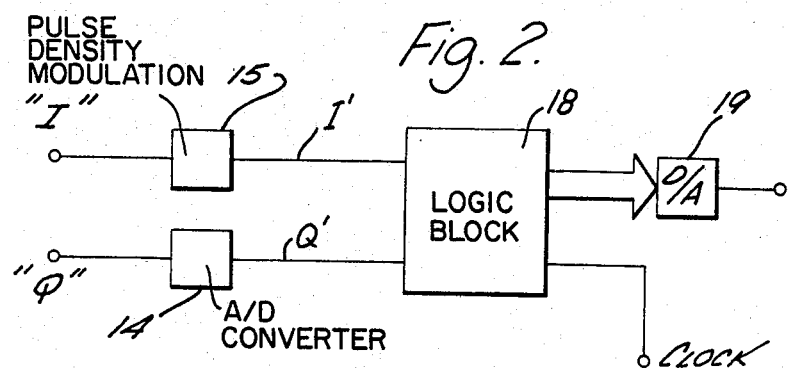
FIG. 2 illustrates a demodulator arrangement according to the invention.
Figure 3:
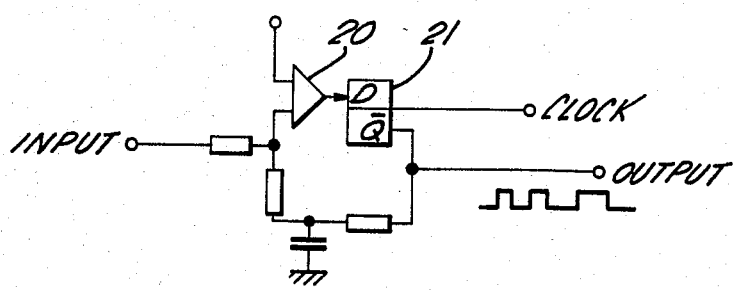
FIG. 3 illustrates the principle of a delta-sigma modulator.

In the arrangement shown in FIG. 2 the I and Q channels are separately digitised as single serial data streams using analogue-to-digital converters 14, 15, which may be of the delta-sigma modulator type described OR Pulse Density Modulators as described in British Pat. No. 1450989. FIG. 3 shows the basic structure of such a modulator. The analogue input is compared with a reference voltage in comparator 20. The difference between the input and reference voltages sets the D input of a clocked bistable 21. The $\overline{Q}$ output of the bistable is applied in a negative feedback to the input. The outputs of the pulse density modulators are applied to a logic block 18. Logic block 18 produces a digital word output dependent on the states of the I & Q pulse density inputs. There may also be a clock input to the block 18. The outputs are applied to a digital-to-analogue converter 19 when necessary, and smoothed using a low-pass filter which may consist simply of an RC section, or which may be a more complex filter.

Figure 4:
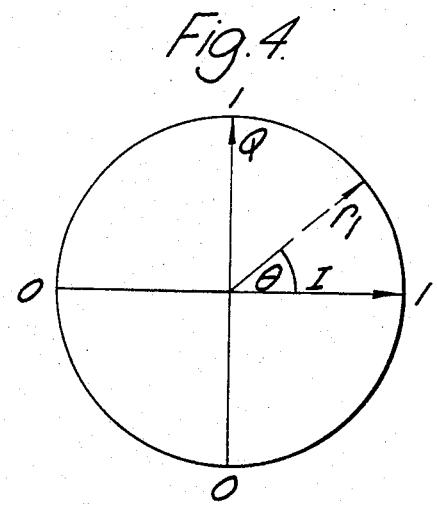
FIG. 4 is a phasor diagram relating to the function of the circuitry of FIG. 2, FIGS. 5 & 6 are further phasor diagrams.

The function of the circuitry may be seen with reference to FIG. 4 which shows a phasor diagram. The reference phase for this diagram is the local oscillator phase and the amplitudes of two channels are represented on the axes at right-angles. An input signal at any instant in time may be represented by a phasor as shown, having relative phase $\theta$, and amplitude $r_1$. Thus, for example, a frequency modulated signal would have constant amplitude and the phase would vary as the integral of the modulating information in the usual way. A continuous-wave carrier would be represented by a phasor which rotated at a constant speed either clockwise or anti-clockwise depending on whether it were higher or lower in frequency than the local oscillator.

In the present case, the values of I or Q at the digital processor are constrained to be zero or one or a series of such digits since they are a digital data stream and we choose to represent all zeros at the left or bottom of the diagram and all ones at the right or top.

TABLE I

| I | Q | Phase |
|---|---|-------|
| 0 | 0 | 225° |
| 0 | 1 | 135° |
| 1 | 0 | 315° |

TABLE I-continued

| I | Q | Phase |
|---|---|-------|
| 1 | 1 | 45°   |

The amplitude may be represented by any number of digits of the data streams and an approximation to the amplitude or phase decoded.

For example, for one data bit at a time, the phase may clearly be deduced to be in one quadrant and assigned that value by the logic block as given in Table I.

Since the phase values are binarily related to 90° increments, this phase can be represented by a two bit data output. A logic circuit to implement this is given in FIG. 7.

By subtracting one phase value from the previous phase value, the differential of the phase (i.e. the frequency) is demodulated. Thus, just as the inputs are estimated by an incremental digital stream, the demodulated outputs are also estimated. When these outputs are smoothed, an adequate approximation to the required demodulated information is obtained.

While the approximations made above are accurate for phasors which truly lie in the 45° or 135° positions etc, intermediate values are not so accurately demodulated, since they are formed as a linear approximation between the available outputs. The peak error in this process is half-way between the set values: for example, a phasor which actually would be represented by exact values of I equals unity and Q equals three quarters will be approximated as one half of 45°, that is, 22.5°, whereas the correct output is arc tangent 0.5 which is 26.6°. This is in fact the peak error and is clearly repeated at eight points around the phasor diagram and has a maximum value of about ±4°. In many circumstances, this approximation is adequate. However, if greater fidelity is needed, then this can be provided by taking more than one sample of data at a time.

Figure 5:
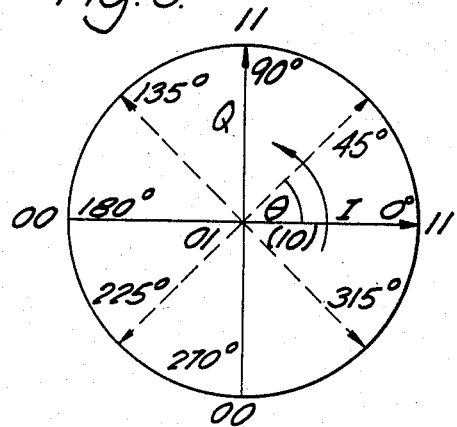
Figure 6:
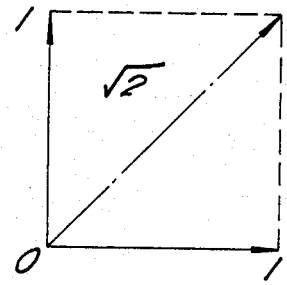

FIGS. 5 and 6 show the case where a pair of sequential samples of the I and Q data are used. Thus the left and bottom is '00' the right and top '11' and a value of 0.5 assigned to the combinations '01' or '10' at the centre—('01' and '10' have the same significance since each data sample has equal weight). Correct output values may now be assigned for the intermediate samples.

FIG. 5 shows the phase outputs. In a similar fashion, FIG. 6 gives the amplitude values for the first quadrant, and Table II summarises the values for this case. Note that for the phase output the I=10, Q=10 case is undefined. In this case the output may be held at the previous value or an interpolation made between previous and subsequent values.

TABLE II

| I  | Q  | PHASE($\theta$) | AMPLITUDE(r) | POWER $\sqrt{2}$ |
|----|----|-----------------|--------------|------------------|
| 00 | 00 | 225°            | $\sqrt{2}$   | 2                |
| 00 | 10 | 180°            | 1            | 1                |
| 00 | 11 | 135°            | $\sqrt{2}$   | 2                |
| 10 | 00 | 270°            | 1            | 1                |
| 10 | 11 | 90°             | 1            | 1                |
| 11 | 00 | 310°            | $\sqrt{2}$   | 2                |
| 11 | 10 | 0°              | 1            | 1                |
| 11 | 11 | 45°             | $\sqrt{2}$   | 2                |
| 10 | 10 | UNKNOWN         | 0            | 0                |

NOTE 10 = 01 as well

In both of these cases, the output samples are only available at half the clock rate of the analogue-to-digital converters. However, this is more than compensated by the improved accuracy.

Alternatively, the data from the 'one-bit' analogue-to-digital converter may be slipped through such that each bit is used twice and the output remains at the original clock sampling rate.

Clearly, the principle may be extended to taking any number of bits of data at a time. It will also be clear that as the clock frequency is made higher, smaller analogue input signals can be demodulated with adequate resolution. That is, the dynamic range of the processor can be increased directly with the clock rate.

Figure 7:
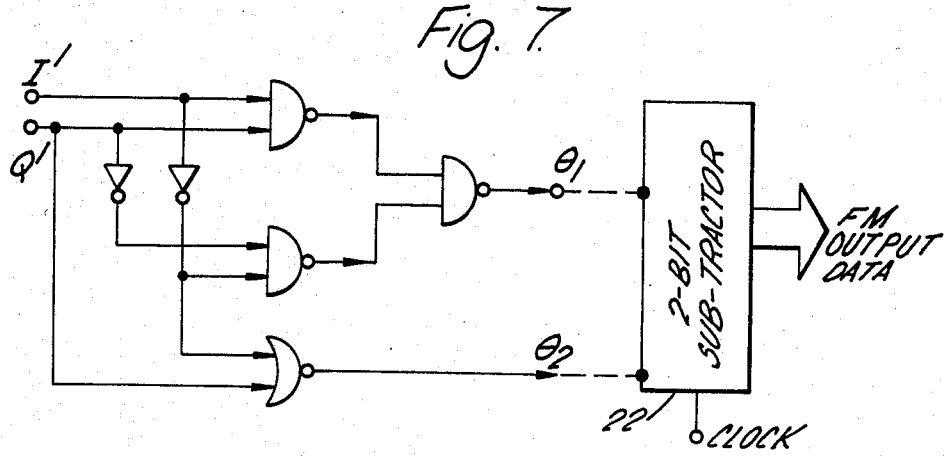
FIG. 7 illustrates an implementation of the demodulator logic of FIG. 1.

The hardware needed for the block 18 in FIG. 2 consists in essence of logic to implement either Table I or Table II as a truth table. FIG. 7 shows an exemplary implementation for the simplest case of the one-bit-at-a-time phase and frequency demodulator. In this case, the phase values have binary weights (i.e. 0, 45, 90) and can thus be directly assigned. The combinational logic shown is merely one possible way of achieving the function required.

For frequency demodulation the differential of the phase is required and this may be obtained by subtracting each phase output word from its predecessor. The subtractor block 22 uses the clock input to time the storing of one word and its subtraction from the previous one. A 2-bit output (i.e. without the most-significant bit) is used.

To implement the amplitude values of Table I and the whole of Table II, outputs from the processor block 18 are needed which do not have simple binary relationships. Two possibilities exist here: firstly, the correct values may be assigned at the point of digital-to-analogue conversion. Thus, the digital-to-analogue converter is provided with weighted outputs (set, for example, by the ratios of resistors or capacitors or the width of pulses, etc.) which have the values of 1, $\sqrt{2}$, $\sqrt{0.5}$ etc., as necessary. This method is suitable where no further digital processing is employed.

Figure 8:
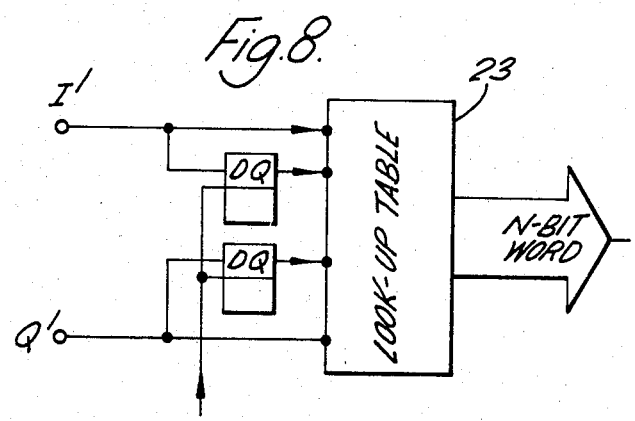
FIG. 8 illustrates an alternative implementation of the demodulator logic.

The second method outputs a conventional binary weighted digital word of sufficient number of bits to describe the required values to any accuracy desired. Thus, to give a better than 1% accuracy, a 7-bit word is employed. However, only a small number of such words are needed (e.g. 3 for the two-bits-at-a-time amplitude demodulator, including all zeros and all ones as two of them). In this case, the simplest hardware form is a look-up table 23, FIG. 8, addressed with the I' and Q' values and outputting the appropriate word. This data word can now be further processed using conventional digital signal processing techniques.

A number of other functions may also be needed in practical equipments. These may be derived from the fundamental data of phase and amplitude or will sometimes be more conveniently obtained directly. For example, for automatic gain control feedback, an output is needed which is derived from the square of the amplitude. This can be provided directly by $(I^2+Q^2)$. The result of this is compared with a threshold and a single bit output provided whenever the value is exceeded. Smoothing this value gives the analogue a.g.c. voltage. Table II gives the conversion values applicable to this case.

Figure 9:
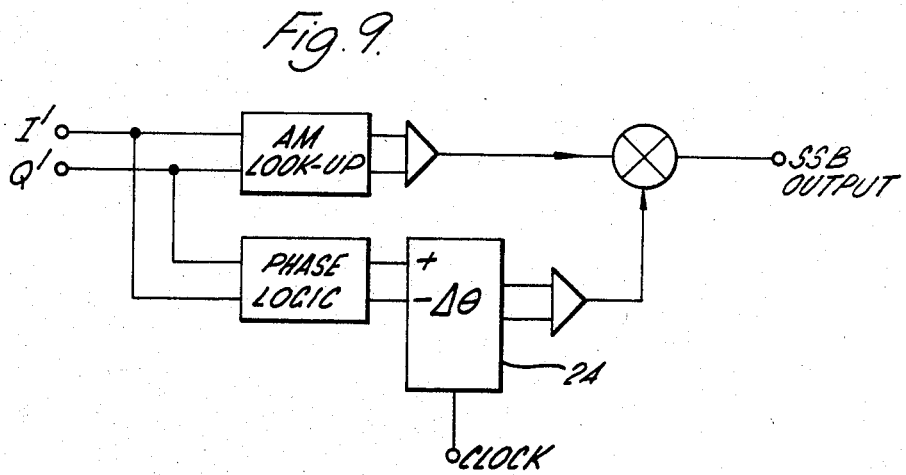
FIG. 9 illustrates an implementation for 55B demodulation.

Single-sideband demodulation requires a special configuration as given in patent application No. 8127797. The local oscillator is nominally placed in the centre of the sideband and the phase of the output samples then needs to be shifted at a rate which is the equivalent of the offset frequency from the originals (suppressed) carrier. FIG. 9 shows the required circuitry for the one-bit-at-a-time case. The phase is shifted by adding or subtracting a fixed number (depending on whether the signal is an upper or lower sideband) in the phase logic 24.

I claim:

1. A direct conversion radio receiver comprising means for receiving a modulated carrier frequency signal and for converting the signal to in-phase and quadrature-phase baseband signals; a pair of analog-to-digital conversion means connected to said receiving means for converting the in-phase and quadrature-phase signals into respective pulse density modulated (PDM) digital data streams; and logic means coupled to said pair of conversion means and responsive to said pulse density modulated digital data streams for providing a demodulated output signal.

2. A receiver according to claim 1 wherein each analogue-to-digital conversion means comprises a delta-sigma modulator.

3. A receiver according to claim 1 wherein the logic means includes look-up table means addressed by the digital data and combinational logic coupled to said look-up table means wherein the output of the look-up table means is a binary weighted digital word defining values of an analogue signal represented by the digital signals.

4. A method of demodulating a pair of related in-phase and quadrature-phase signals provided by a zero I.F. or direct conversion radio receiver comprising analog-to-digital converting each of said in-phase and quadrature-phase signals into respective pulse density modulated (PDM) digital data streams; and logically processing said pulse density modulated digital data streams in accordance with a predetermined table of input logic conditions to provide a demodulated output signal.

* * * * *